(12) United States Patent
Li et al.

(10) Patent No.: US 6,197,706 B1
(45) Date of Patent: Mar. 6, 2001

(54) LOW TEMPERATURE METHOD TO FORM LOW K DIELECTRIC

(75) Inventors: Lain-Jang Li, Hualien; Cheng-Chung Lin, Taipei; Syun-Ming Jang, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/607,042

(22) Filed: Jun. 30, 2000

(51) Int. Cl.[7] .......................... H01L 21/31; H01L 21/469
(52) U.S. Cl. ........................ 438/789; 438/787; 438/788
(58) Field of Search .................................. 438/787, 788, 438/789, 790

(56) References Cited

U.S. PATENT DOCUMENTS

| 4,992,306 | * | 2/1991 | Hocherg et al. | 427/255.3 |
| 5,504,040 | * | 4/1996 | Moslehi | 437/225 |
| 5,643,637 | * | 7/1997 | Rzad et al. | 427/534 |
| 5,643,838 | * | 7/1997 | Dean et al. | 437/238 |

OTHER PUBLICATIONS

A press release on the web-site for Applied Materials, "International Sematech Validates Manufacturing Capability of Applied Material's Low k Solution for Copper Interconnects", Santa Clara, California, Feb. 28, 2000.

* cited by examiner

Primary Examiner—John F. Niebling
Assistant Examiner—Alexander G. Ghyka
(74) Attorney, Agent, or Firm—George O. Saile; Stephen B. Ackerman

(57) ABSTRACT

Black diamond films, deposited using PECVD at low substrate temperatures, have been effectively stabilized by immersing them in de-ionized water at a temperature of about 90° C. for about 20 minutes or in a hydrogen peroxide solution (typically at a concentration of 10%) for about 60 minutes. Since it has been observed that the dielectric constant of the stabilized film increases with both immersion time and/or peroxide concentration, this effect may be used as a means for adjusting the dielectric constant of a black diamond film. Standard analytical techniques confirm that these low temperature stabilized films have electrical properties that are at least as good as those of films stabilized using high temperature heat treatments.

20 Claims, 2 Drawing Sheets

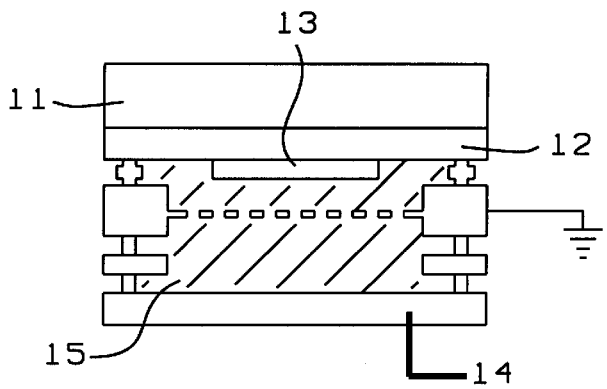
FIG. 1 – Prior Art
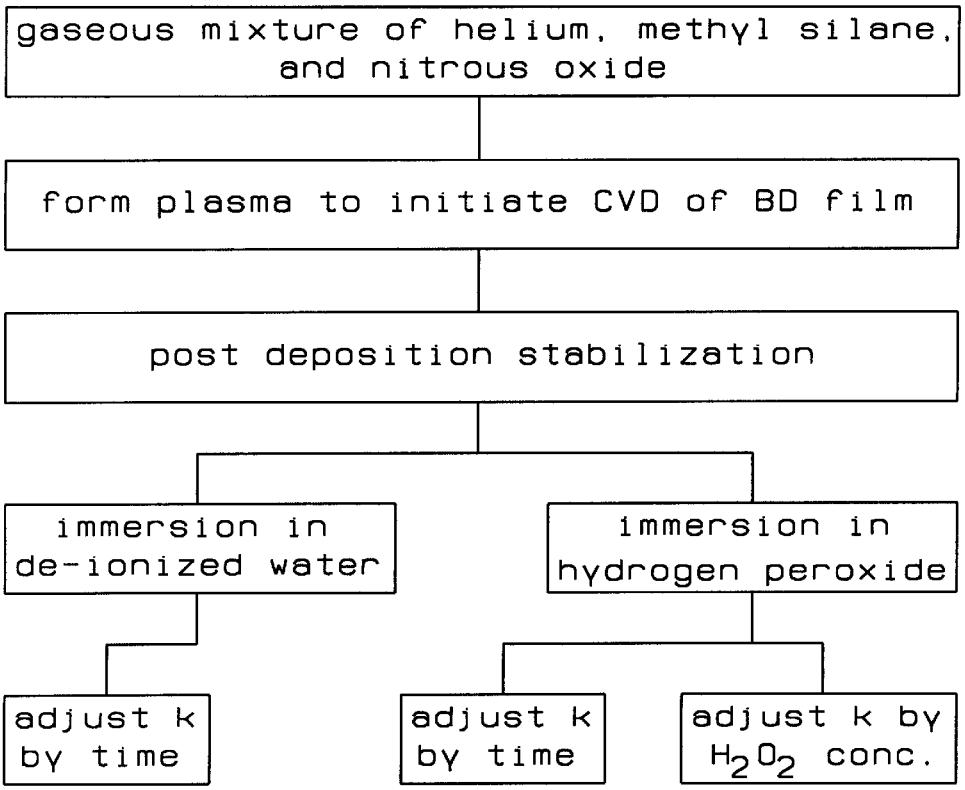
FIG. 2

LOW TEMPERATURE METHOD TO FORM LOW K DIELECTRIC

FIELD OF THE INVENTION

The invention relates to the general field of low dielectric constant layers for use in integrated circuits with particular reference to methods for forming and stabilizing such films at or near room temperature.

BACKGROUND OF THE INVENTION

The internal dimensions within integrated circuits continue to shrink, including the thicknesses of the dielectric layers used to separate various layers of wiring from one another. However, as these wiring levels are brought closer together, the possibility of cross-coupling between them starts to rise as well as the incidence of parasitic capacitances. One way to minimize this problem is to reduce the dielectric constants of these inter-metal layers. Thus there is considerable interest in developing low k materials as well as deposition methods for them that are compatible with integrated circuit technology.

For our purposes we will define a low k dielectric as one that has a dielectric constant dose to or less than about 3. Several such materials are known to exist but they have the disadvantage that they are organic rather than inorganic compounds. Examples include hydrogen silsesquioxane, fluorinated polyimide, polyarylene ether, fluorinated arylene ether, polytetrafluoro-ethylene, and benzocyclobutene. Because of their organic nature these materials are innately soft, which physical property can give rise to problems during semiconductor processing, particularly during planarization.

The present invention is concerned with a low dielectric constant material that is essentially inorganic in nature, referred to by practitioners of the art as black diamond, or BD. BD is silica that has been doped with about 10 mole % methane. When formed as will be described below, BD is porous, about 36% of its volume being in the form of pores having a diameter between about 8 and 24 Angstroms.

To be of acceptable quality, the resistivity of an inter-metal dielectric layer needs to exceed about $10^5$ ohm-cm. In practice an indication of the 'leakiness' of any given film can be obtained by measuring its flat-band voltage. This is the gate voltage required tp bring about the flat-band condition, so the higher the flat-band voltage, the greater the leakage current associated with the film., Two processes have been used in the prior art to form BD films of acceptable quality. In the hot film method, a mixture of trimethyl silane, silane, nitrous oxide, and oxygen is used at about 400° C. to form a plasma out of which the BD deposits. In the cold film method, deposition of the BD film takes place from a room temperature plasma of a mixture of helium, methyl silane, and nitrous oxide.

It has been found that films deposited by the cold film method are, as deposited, of poor quality. To raise the quality to acceptable levels, the practice of the prior art has been to first stabilize them by heating in oxygen for about 40 minutes at about 200° C. followed by further heating in nitrogen for about 30 minutes at about 400° C. This post-deposition treatment adds to the overall manufacturing cost, both because of the extra energy that must be expended (increased thermal budget) as well as because of the associated reduction of product throughput in the manufacturing line.

A routine search of the prior art was performed but no references that teach the exact processes and structures of the present invention were discovered. Several references of interest were, however, encountered along the way. For example, in U.S. Pat. No. 5,504,040, Moslehi shows a dielectric oxide process that uses a chuck chilling device while in U.S. Pat. No. 4,992,306 Hochberg teaches a deposition process for silicon oxide low k using organic reactants. Reference to BD was found on the web-site for Applied Materials in the form of a press release dated Feb. 28, 2000 describing this material.

SUMMARY OF THE INVENTION

It has been an object of the present invention to provide a process for stabilizing black diamond films at a temperature at or near room temperature.

Another object of the invention has been to provide a method for adjusting the dielectric constant of black diamond films as part of the stabilization process.

These objects have been achieved by immersing the as-deposited films in de-ionized water at a temperature of about 90° C. for about 20 minutes or in a hydrogen peroxide solution (typically at a concentration of 10%) for about 60 minutes. Since it has been observed that the dielectric constant of the stabilized film increases with both immersion time and/or peroxide concentration, this effect may be used as a means for adjusting the dielectric constant of a black diamond film. Standard analytical techniques confirm that these low temperature stabilized films have electrical properties that are at least as good as those of films stabilized using high temperature heat treatments.

BRIEF DESCRIPTION OF THE DRAWINGS

FIG. 1 shows the apparatus used to deposit the films.

FIG. 2 compares Infrared spectra for prior art films and those of the present invention.

DESCRIPTION OF THE PREFERRED EMBODIMENTS

Figure 3:
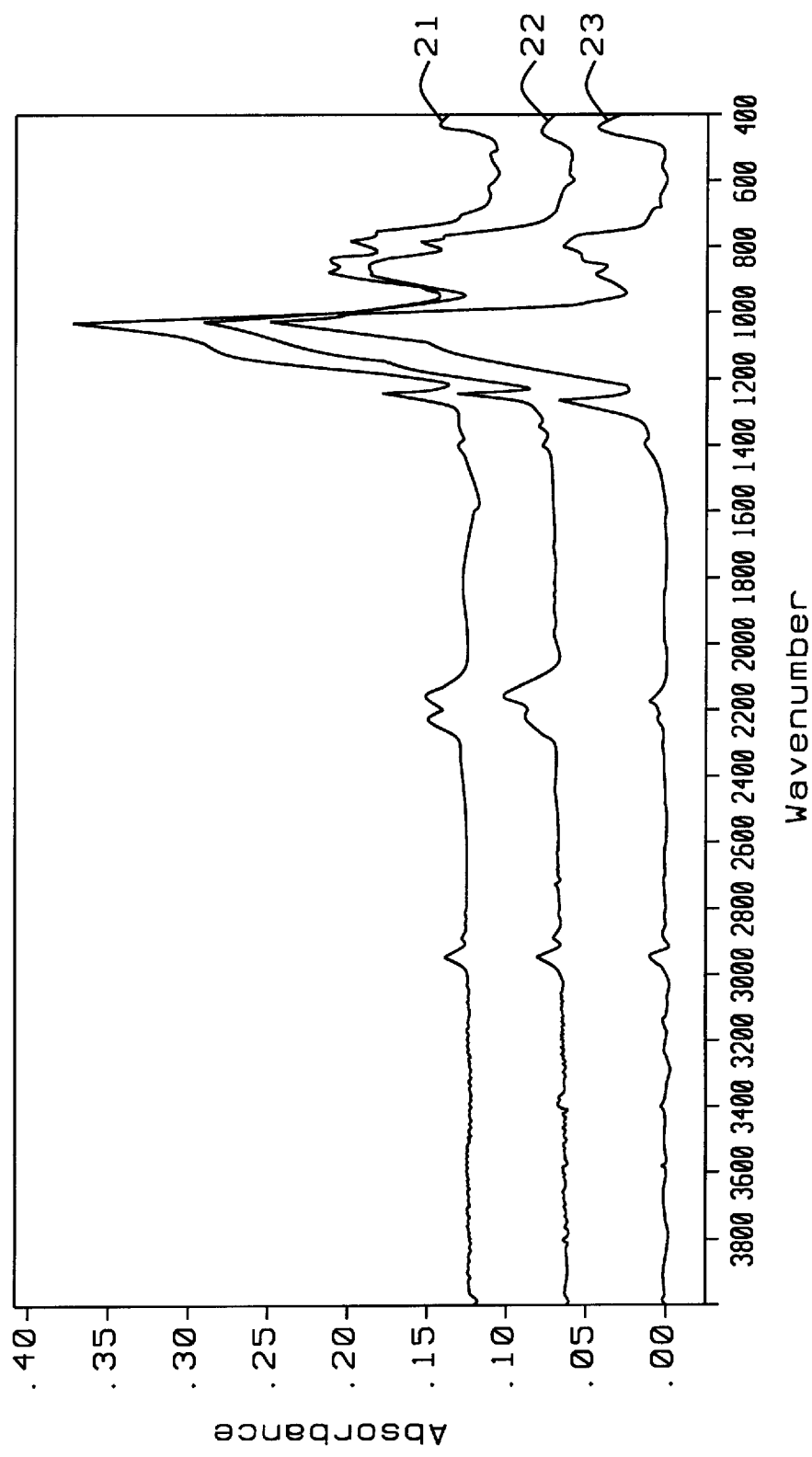
FIG. 3 is a flow chart summarizing the various stabilizing options offered by the present invention.

As indicated above, BD films formed by the so-called cold method have (in the prior art) required a post-deposition heat treatment to stabilize the films. We now disclose several methods by which the films may be stabilized by treating them at or close to room temperature. Additionally, the dielectric constant of any given stabilized film has been found to vary, over a small range and in a predictable way, with the exact treatment given. We therefore also disclose application of this observation to a method for controlling dielectric constant in BD films.

First Embodiment

Referring now to FIG. 1, we show there a vacuum tight chamber 11 suitable for performing plasma enhanced chemical vapor deposition (PECVD). A gaseous mixture of helium, methyl silane, and nitrous oxide is admitted into the chamber through a gas manifold (not shown). The helium has a flow rate between about 800 and 2,000 SCCM, the methyl silane has a flow rate between about 50 and 90 SCCM, and the nitrous oxide has a flow rate between about 350 and 400 SCCM. RF power is then applied at RF electrode 14. This stimulates the gas to form plasma 15 initiating chemical vapor deposition of a layer of black diamond on substrate 13 which can be heated by heater 12. The substrate is at a temperature between about 15 and 25° C. while the layer is depositing. When the thickness of the film is between about 2,000 and 6,000 Angstroms, CVD is stopped and the film is removed from the chamber.

Post-deposition stabilization of the BD film now follows. As a key feature of the invention, said stabilization treatment is performed near room temperature. Specifically, the layer of black diamond is immersed in de-ionized water at a temperature between about 70 and 90° C. for between about 10 and 60 minutes, thereby stabilizing the layer.

Second Embodiment

Referring once more to FIG. 1, we show there a vacuum tight chamber 11 suitable for performing plasma enhanced chemical vapor deposition (PECVD). A gaseous mixture of helium, methyl silane, and nitrous oxide is admitted into the chamber through a gas manifold (not shown). The helium has a flow rate between about 800 and 2,000 SCCM, the methyl silane has a flow rate between about 50 and 90 SCCM, and the nitrous oxide has a flow rate between about 350 and 400 SCCM. RF power is then applied at RF electrode 14. This stimulates the gas to form plasma 15 initiating chemical vapor deposition of a layer of black diamond on substrate 13. The substrate is at a temperature between about 15 and 25° C. while the layer is depositing. When the thickness of the film is between about 2,000 and 6,000 Angstroms, CVD is stopped and the film is removed from the chamber.

Post-deposition stabilization of the BD film now follows. As a key feature of the invention, said stabilization treatment is performed at or near room temperature. Specifically, the layer of black diamond is immersed in an aqueous solution of between about 5 and 10 weight % hydrogen peroxide, for between about 10 and 60 minutes, thereby stabilizing the layer.

Third Embodiment

This, and the following two embodiments, are concerned with applying our observed variation of dielectric constant with stabilization specifics to a method for controlling the dielectric constant of BD films. As above, we show in FIG. 1 a vacuum tight chamber 11, suitable for performing plasma enhanced chemical vapor deposition (PECVD). A gaseous mixture of helium, methyl silane, and nitrous oxide is admitted into the chamber through a gas manifold (not shown). The helium has a flow rate between about 800 and 2,000 SCCM, the methyl silane has a flow rate between about 50 and 90 SCCM, and the nitrous oxide has a flow rate between about 350 and 400 SCCM. RF power is then applied at RF electrode 14. This stimulates the gas to form a plasma initiating chemical vapor deposition of a layer of black diamond on substrate 13. The substrate is at a temperature between about 15 and 25° C. while the layer is depositing. When the thickness of the film is between about 2,000 and 6,000 Angstroms, CVD is stopped and the film is removed from the chamber.

Low temperature post-deposition stabilization of the BD film, as disclosed in the first two embodiments, now follows. As in the first embodiment, the layer of black diamond is immersed in de-ionized water at a temperature of about 90° C. By adjusting the length of time for which immersion takes place to be between 5 and 60 minutes, it is possible to select a dielectric constant value for the BD film that is between 3.0 and 4.0. The dielectric constant changes linearly with time while it is immersed so any intermediate value between the end points can readily be obtained.

Note that the invention is not limited to the above-specified immersion temperature of 90° C., it being chosen only as an example. It will be readily understood by one skilled in the art that any immersion temperature within the range given in the first embodiment may be used. If this is done, the time and k value end points would change accordingly with the dielectric constant changing more rapidly with time at the higher immersion temperatures.

Fourth Embodiment

Preparation of the BD film is as described for the third embodiment. As before, this is followed by a low temperature post-deposition stabilization treatment. Unlike the third embodiment, this is performed at room temperature with immersion being in an aqueous solution of 10 weight % hydrogen peroxide. By adjusting the length of time for which immersion takes place to be between 10 and 60 minutes, it is possible to select a dielectric constant value for the BD film that is between 3.0 and 4.0. The dielectric constant changes linearly with time while it is immersed in the hydrogen peroxide so any intermediate value between the end points can readily be obtained.

Fifth Embodiment

Preparation of the BD film is as described for the other embodiments. Also as before, this is followed by a low temperature post-deposition stabilization treatment. As in the fourth embodiment, this is performed at room temperature with immersion being in an aqueous solution of hydrogen peroxide. Immersion is for about 20 minutes. By adjusting the concentration of the hydrogen peroxide to be between 5 and 10 weight %, it is possible to select a dielectric constant value for the BD film that is between 3.0 and 3.9. The dielectric constant increases linearly with hydrogen peroxide concentration, so any intermediate value between the end points can readily be obtained.

Note that the invention is not limited to the above-specified immersion time, it being chosen only as an example. It will be readily understood by one skilled in the art that any immersion time within the range given in the first embodiment may be used. If this is done, the concentration and k value end points would change accordingly with the dielectric constant increase with concentration being larger for longer immersion times.

A flow chart summarizing all five embodiments is provided in FIG. 2.

BD layers stabilized in accordance with any of the above-described embodiments have been found to be of equal or better quality than BD films stabilized using the methods of the prior art. Evidence for this can be seen in the FTIR (Fourier Transform Infrared) spectra shown in FIG. 3 which plot % absorbance as a function of the wave number in $cm^{-1}$. Curve 21 is for a BD film stabilized according to the methods of the prior art. Curve 22 is for a BD film stabilized, in accordance with the present invention, by dipping in de-ionized water while curve 23 is for a BD film stabilized, also in accordance with the present invention, by dipping in hydrogen peroxide. As can be seen, key peaks such as that due to Si—O stretching at 1100 wave numbers and that due to Si—H at 2190 are present at full amplitude, indicating high quality films in all cases.

Finally, in TABLE I below we summarize the results of several different ways of performing the stabilization step for the as-deposited BD film.

TABLE I

| Stabilization step | k value | Flat-band voltage | RI |
|---|---|---|---|
| Furnace $O_2$, 200° C. | 3.10 | −41.0 V | 1.421 |
| DI water 90° C. 20 min. | 2.99 | −11.0 V | 1.440 |
| 10% $H_2O_2$ r.t. 10 min. | 3.03 | −1.4 V | 1.425 |
| 10% $H_2O_2$ r.t. 60 min. | 3.46 | −0.5 V | 1.447 |
| 5% $H_2O_2$ r.t. 30 min. | 3.21 | −2.1 V | 1.430 |

While the invention has been particularly shown and described with reference to the preferred embodiments thereof, it will be understood by those skilled in the art that various changes in form and details may be made without departing from the spirit and scope of the invention.

What is claimed is:

1. A process for forming a layer of low dielectric constant material, comprising:
   providing a vacuum tight chamber and causing to flow through it a gaseous mixture of helium, methyl silane, and nitrous oxide;
   electrically stimulating said gaseous mixture to form a plasma whereby, through chemical vapor deposition, a layer of black diamond deposits on a substrate;
   removing said layer of black diamond from the chamber; and
   immersing the layer of black diamond in deionized water, at a temperature between about 70 and 90° C. for between about 10 and 60 minutes, thereby stabilizing the layer.

2. The process recited in claim 1 wherein the helium has a flow rate between about 800 and 2,000 SCCM, the methyl silane has a flow rate between about 50 and 90 SCCM, and the nitrous oxide has a flow rate between about 350 and 400 SCCM.

3. The process recited in claim 1 wherein the substrate is at a temperature between about 15 and 25° C. while the layer is depositing.

4. The process recited in claim 1 wherein the stabilized layer of black diamond has a thickness between about 2,000 and 6,000 Angstroms.

5. A process for forming a layer of low dielectric constant material, comprising:
   providing a vacuum tight chamber and causing to flow through it a gaseous mixture of helium, methyl silane, and nitrous oxide;
   electrically stimulating said gaseous mixture to form a plasma whereby, through chemical vapor deposition, a layer of black diamond deposits on a substrate;
   removing said layer of black diamond from the chamber; and
   at room temperature, immersing the layer of black diamond in an aqueous solution of between about 5 and 10 weight % hydrogen peroxide, for between about 10 and 60 minutes, thereby stabilizing the layer.

6. The process recited in claim 5 wherein the helium has a flow rate between about 800 and 2,000 SCCM, the methyl silane has a flow rate between about 50 and 90 SCCM, and the nitrous oxide has a flow rate between about 350 and 400 SCCM.

7. The process recited in claim 5 wherein the substrate is at a temperature between about 15 and 25° C. while the layer is depositing.

8. The process recited in claim 5 wherein the stabilized layer of black diamond has a thickness between about 2,000 and 6,000 Angstroms.

9. A method for varying dielectric constant in a layer of black diamond, comprising:
   providing a vacuum tight chamber and causing to flow through it a gaseous mixture of helium, methyl silane, and nitrous oxide;
   electrically stimulating said gaseous mixture to form a plasma whereby, through chemical vapor deposition, a layer of black diamond deposits on a substrate;
   removing said layer of black diamond from the chamber;
   immersing the layer of black diamond in de-ionized water at a temperature of about 90° C. for a period of time; and
   by adjusting said period of time to be between 10 and 60 minutes, forming a stabilized layer of black diamond having a dielectric constant that is between 3.0 and 4.0.

10. The method of claim 9 wherein the helium has a flow rate between about 800 and 2,000 SCCM, the methyl silane has a flow rate between about 50 and 90 SCCM, and the nitrous oxide has a flow rate between about 350 and 400 SCCM.

11. The method of claim 9 wherein the substrate is at a temperature between about 15 and 25° C. while the layer is depositing.

12. The method of claim 9 wherein the stabilized layer of black diamond has a thickness between about 2,000 and 6,000 Angstroms.

13. A method for varying dielectric constant in a layer of black diamond, comprising:
   providing a vacuum tight chamber and causing to flow through it a gaseous mixture of helium, methyl silane, and nitrous oxide;
   electrically stimulating said gaseous mixture to form a plasma whereby, through chemical vapor deposition, a layer of black diamond deposits on a substrate;
   removing said layer of black diamond from the chamber;
   immersing the layer of black diamond in an aqueous solution of 10 weight % hydrogen peroxide at room temperature for a period of time; and
   by adjusting said period of time to be between 10 and 60 minutes, forming a stabilized layer of black diamond having a dielectric constant that is between 3.0 and 4.0.

14. The method of claim 13 wherein the helium has a flow rate between about 800 and 2,000 SCCM, the methyl silane has a flow rate between about 50 and 90 SCCM, and the nitrous oxide has a flow rate between about 350 and 400 SCCM.

15. The method of claim 13 wherein the substrate is at a temperature between about 15 and 25° C. while the layer is depositing.

16. The method of claim 13 wherein the stabilized layer of black diamond has a thickness between about 2,000 and 6,000 Angstroms.

17. A method for varying dielectric constant in a layer of black diamond, comprising:
   providing a vacuum tight chamber and causing to flow through it a gaseous mixture of helium, methyl silane, and nitrous oxide;
   electrically stimulating said gaseous mixture to form a plasma whereby, through chemical vapor deposition, a layer of black diamond deposits on a substrate;
   removing said layer of black diamond from the chamber;
   immersing the layer of black diamond in an aqueous solution of hydrogen peroxide; and by adjusting the concentration of the hydrogen peroxide to be between 5 and 10 weight %, forming a stabilized layer of black diamond having a dielectric constant that is between 3.0 and 4.0.

18. The method of claim 17 wherein the helium has a flow rate between about 800 and 2,000 SCCM, the methyl silane has a flow rate between about 50 and 90 SCCM, and the nitrous oxide has a flow rate between about 350 and 400 SCCM.

19. The method of claim 17 wherein the substrate is at a temperature between about 15 and 25° C. while the layer is depositing.

20. The method of claim 17 wherein the stabilized layer of black diamond has a thickness between about 2,000 and 6,000 Angstroms.

\* \* \* \* \*